(12) United States Patent
Schulz (10) Patent No.: US 10,238,014 B2
(45) Date of Patent: Mar. 19, 2019

(54) CONVERTER

(71) Applicant: Siemens Aktiengesellschaft, Munich (DE)

(72) Inventor: Martin Schulz, Munich (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 15/699,285

(22) Filed: Sep. 8, 2017

(65) Prior Publication Data
US 2018/0084666 A1    Mar. 22, 2018

(30) Foreign Application Priority Data

Sep. 22, 2016    (EP) ..................................... 16190118

(51) Int. Cl.
*H05K 7/20*    (2006.01)
*H02M 7/48*    (2007.01)
(Continued)

(52) U.S. Cl.
CPC ............. *H05K 7/209* (2013.01); *H01L 23/36* (2013.01); *H02M 7/003* (2013.01); *H02M 7/48* (2013.01);
(Continued)

(58) Field of Classification Search
CPC ..... H05K 7/1432; H05K 7/209; H02M 7/003; H02M 7/48; H02M 2001/327; H02M 2007/4835; H01L 2924/00
(Continued)

(56) References Cited

U.S. PATENT DOCUMENTS 7,485,987 B2* 2/2009 Mori .................. H02M 7/49
307/105
8,400,796 B2* 3/2013 Dofnas ................ H02M 7/483
363/71
(Continued)

FOREIGN PATENT DOCUMENTS

DE    102007060429 A1    6/2009    ............. H01R 12/51
DE    102008035075 A1    2/2010

OTHER PUBLICATIONS

European Search Report, Application No. 16190118.6, 6 pages, dated Mar. 10, 2017.

*Primary Examiner* — Anatoly Vortman
(74) *Attorney, Agent, or Firm* — Slayden Grubert Beard PLLC (57) ABSTRACT

The present disclosure relates to converters. Embodiments of the teachings herein may be employed for converting an input voltage present between two input terminals into an alternating voltage with a prespecified amplitude and frequency for the activation of a single or multiphase load. For example, a converter may include: at least two submodules of an inverter arm connected in series with one another and a heat sink. Each of the submodules may include: a circuit carrier; at least two controllable switching elements electrically connected on the circuit carrier; and a first and a second terminal. The first main terminals of the controllable switching elements may be connected thermally to a cooling surface of the heat sink. The heat sink may include a number of heat sink parts electrically insulated from one another. An electrical connection of the second submodule terminal of the first submodule to the first submodule terminal of the second submodule may include a respective assigned heat sink part.

15 Claims, 4 Drawing Sheets

(51) Int. Cl.
   *H02M 7/00*     (2006.01)
   *H05K 7/14*     (2006.01)
   *H01L 23/36*    (2006.01)
   *H02M 7/483*    (2007.01)
   *H02M 1/32*     (2007.01)

(52) U.S. Cl.
   CPC ..... *H05K 7/1432* (2013.01); *H02M 2001/327* (2013.01); *H02M 2007/4835* (2013.01)

(58) Field of Classification Search
   USPC ....................................................... 361/716
   See application file for complete search history.

(56) References Cited

U.S. PATENT DOCUMENTS

| | | | | |
|---|---|---|---|---|
| 8,564,981 B2* | 10/2013 | Harnefors | ............ | H02M 1/126 |
| | | | | 363/40 |
| 9,184,673 B2* | 11/2015 | Mihalache | .............. | H02P 27/14 |
| 2010/0026371 A1 | 2/2010 | Komma et al. | ................ | 327/431 |
| 2013/0003299 A1* | 1/2013 | Wissner | ................ | H02M 7/003 |
| | | | | 361/695 |
| 2014/0022738 A1* | 1/2014 | Hiller | ................... | H05K 7/1432 |
| | | | | 361/730 |
| 2015/0124506 A1* | 5/2015 | Sahoo | ................... | H02M 5/225 |
| | | | | 363/126 |
| 2016/0165759 A1* | 6/2016 | Buschendorf | ......... | H02M 7/003 |
| | | | | 361/709 |
| 2016/0226367 A1 | 8/2016 | Raubo et al. | ................. | 363/123 |

\* cited by examiner

CONVERTER

CROSS-REFERENCE TO RELATED APPLICATIONS

This application claims priority to EP Application No. 16190118.6 filed Sep. 22, 2016, the contents of which are hereby incorporated by reference in their entirety.

TECHNICAL FIELD

The present disclosure relates to converters. Embodiments of the teachings herein may be employed for converting an input voltage present between two input terminals into an alternating voltage with a prespecified amplitude and frequency for the activation of a single or multiphase load.

BACKGROUND

Modern modular converter topologies with multilevel characteristics consist of identically-constructed functional units, which are referred to as submodules. Submodules are constructed either as half bridge or full bridge submodules. These are connected in series with one another to provide an inverter phase. The interconnection of a plurality of half bridge submodules in series takes up a lot of space. This makes for high costs of the converter.

In low-voltage applications it is usual to construct modular topologies from circuit board-based submodules with discrete power semiconductor switching elements. The use of circuit boards leads to further problems caused by the limited current carrying capacity of the circuit boards and the inferior cooling conditions when compared to power modules in which the power semiconductor switching elements are attached directly to a circuit carrier (so-called Direct Copper Bonding (DCB)). Significant heat losses due to current, which must be dissipated, occur in the connecting cables and at the contact points between connecting cables and circuit boards.

The electrical connection between the discrete power semiconductor switching elements and the screw contacts or clamp contacts of the cables may include copper tracks on the circuit carriers. To guarantee the current carrying capability needed, more expensive high-current circuit carriers are used. These are known as thick copper boards or as boards with inserted copper profiles.

The heat in a circuit board-based converter is removed directly at a main terminal (the drain or collector terminal of the power semiconductor switching element). To do this the power semiconductor switching element is pressed directly with its terminal contact over a large surface against a heat sink. To avoid an electrical connection between the terminal contact and the heat sink, an insulator is arranged between these two surfaces.

The heat lost due to current in the connecting cables and at the contact points can be minimized and dissipated through larger cable cross sections and larger contacts. Once again however this leads to the mounting technology and connection technology consequently being very large and heavy. Despite this, the circuit board-based realization of a converter is frequently preferred to DCB-based converters, since such a converter has better electrical characteristics.

SUMMARY

The teachings of the present disclosure may be embodied in a converter that is improved in its construction and/or functions. For example, some embodiments include a converter for converting an input voltage ($U_1$) present between two input terminals (101, 102) into an alternating voltage with a prespecified amplitude and frequency for the activation of a single or multiphase load. The converter may include at least two submodules (SM; SM1, . . . , SM8) of an inverter arm interconnected in series with one another. Each of the submodules (SM; SM1, . . . , SM8) may comprise the following: a circuit carrier (11); at least two controllable switching elements ($S_1$, $S_2$), which are electrically interconnected with one another on the circuit carrier (11); a first submodule terminal ($X_1$); a second submodule terminal ($X_2$). First main terminals (D) of the controllable switching elements ($S_1$, $S_2$) of the at least two submodules (SM; SM1, . . . , SM8) are connected thermally over their surface to a cooling surface of a heat sink (12). The second submodule terminal ($X_2$) of a first of the at least two submodules (SM; SM1, . . . , SM8) is connected to the first submodule terminal ($X_1$) of a second of the at least two submodules (SM; SM1, . . . , SM8). The heat sink (12) may comprise a number of heat sink parts (17), wherein the heat sink parts (17) are electrically insulated from one another. The electrical connection of the second submodule terminal ($X_2$) of the first submodule (SM; SM2, . . . , SM8) to the first submodule terminal ($X_1$) of the second submodule (SM; SM1, . . . , SM7) is realized via a respective assigned heat sink part (17) of the heat sink (12).

In some embodiments, the first main terminals (D) of the switching elements ($S_1$, $S_2$) are flat contacts, which are attached by their full surface to the assigned heat sink part (17).

In some embodiments, the first main terminals (D) of the switching elements ($S_1$, $S_2$) are connected by a force fit and/or a material-to-material fit to the assigned heat sink part (17).

In some embodiments, the first main terminals (D) of the switching elements ($S_1$, $S_2$) are connected directly to the assigned heat sink part (17).

In some embodiments, the first main terminals (D) of the switching elements ($S_1$, $S_2$) are connected via a conductive layer (16) attached to the assigned heat sink part (17) to said part.

In some embodiments, the conductive layer (16) is a metal rail.

In some embodiments, the number of heat sinks (12-1, . . . 12-8) is greater by 1 than the number of half bridge submodules (SM; SM1, . . . , SM8).

In some embodiments, the heat sink parts (17) comprise cooling surfaces and/or are able to have a coolant flowing through them.

In some embodiments, the heat sink parts (17) of the heat sink (12) are arranged in one plane.

In some embodiments, the heat sink parts (17) of the heat sink (12) are arranged above one another, wherein the switching elements ($S_1$, $S_2$) assigned to a heat sink part (17) are arranged on main surfaces of the assigned heat sink part (17) lying opposite one another.

In some embodiments, the electrical connection between the second main terminal (S) of the first switching element ($S_1$) and the first main terminal (D) of the second switching element ($S_2$) of a respective half bridge submodule (SM; SM1, . . . , SM8) is realized via one or more conductor tracks of the circuit carrier (11) of the half bridge submodule.

In some embodiments, two inverter arms are connected in series between the two input terminals per phase, wherein a node point is coupled between the two inverter arms to an output terminal of an inverter phase.

In some embodiments, there are at least two submodules (SM; SM1, . . . , SM8) per inverter arm and phase.

In some embodiments, a respective submodule (SM; SM1, . . . , SM8) comprises a half bridge with two controllable and series-interconnected switching elements (S1, S2). The first submodule terminal (X1) is connected electrically to a first main terminal (D) of one of the first of the at least two switching elements (S1, S2). The second submodule terminal (X2) is connected electrically to a node point of a second main terminal (S) of the first switching element (S1) and a first main terminal (D) of a second of the at least two switching elements (S2).

In some embodiments, the submodule (SM; SM1, . . . , SM8) comprises a full bridge with two half bridges interconnected in parallel, wherein in a first of the half bridges a first and a second switching element are interconnected in series and in a second of the half bridges a third and a fourth switching element are interconnected in series. The first submodule terminal ($X_1$) is connected electrically to a node point of a second main terminal (S) of the first switching element and a first main terminal (D) of the second switching element. The second submodule terminal ($X_2$) is connected electrically to a node point of a second main terminal (S) of the third switching element and a first main terminal (D) of the fourth switching element. The first main terminals (D) of the first and third switching element are electrically connected to one another via a further heat sink part (17) of the heat sink (12).

BRIEF DESCRIPTION OF THE DRAWINGS

The teachings of the present disclosure will be explained in greater detail below with reference to embodiments shown in the drawings. In the figures.

DETAILED DESCRIPTION

Some embodiments may include a converter for converting an input voltage present between two input terminals into an alternating voltage with a prespecified amplitude and frequency for the activation of a single or multiphase load. There may be at least two submodules of an inverter arm interconnected in series with one another. Each submodule may comprise the following: a circuit carrier; at least two controllable switching elements, which are electrically interconnected with one another on the circuit carrier; a first submodule terminal; and a second submodule terminal. First main terminals of the controllable switching elements of the at least two submodules may be connected thermally to a cooling surface of a heat sink. The second submodule terminal of a first of the at least two submodules may be connected to a first submodule terminal of a second of the at least two half bridge submodules.

In some embodiments, the heat sink comprises a number of heat sink parts, wherein the heat sink parts are electrically insulated from one another and the electrical connection of the second submodule terminal of the first submodule to the first submodule terminal of the second submodule is realized via a respectively assigned part of the heat sink. In other words this means that at least a part of the current flows from the second submodule terminal of the first submodule to the first submodule terminal of the second submodule via the heat sink part, meaning that the heat sink part is used for current conduction.

In some embodiments, a converter includes submodules constructed on circuit boards. This allows good electrical characteristics of the submodules and of the converter as a whole. At the same time, through the linkage of the submodule terminals to an assigned heat sink part, an excellent heat dissipation of the heat occurring in the semiconductor switching elements is made possible. In some embodiments, it is possible to cool the electrical contacts directly, since no material prevents the dissipation of heat, such as an electrically-insulating insulation layer for example, between the first main terminals and the heat sink part.

In some embodiments, an exclusive contact of the submodules via the first main terminals of the two switching elements enables the series circuit of the submodules to be constructed in a very compact manner. The mounting effort may be minimized. In some embodiments, a lower current flow occurs on the circuit carrier of the submodules by comparison with a conventional submodule, since the current is tapped off directly via the first main terminals of the switching elements. This may result in a lower thermal stress on the circuit carriers.

In some embodiments, the first main terminals of the switching elements are flat contacts, which are attached over their full surface to the assigned heat sink part. It is not just a large current carrying capability that is insured by this. In fact, there can be transfer of the heat generated in the switching elements via the first main terminals in the direction of the heat sink part of the heat sink. In addition, manufacturing is easier since the first main terminals can be connected in a simple manner to the heat sink part. It should be stressed here that commercially-available discrete power semiconductor switching elements can be used as switching elements of the submodules.

In some embodiments, the first main terminals of the switching elements are connected by a force fit and/or by a material-to-material fit to the assigned heat sink part. This insures a good current carrying capability between the first main terminals of switching elements of neighboring submodules. At the same time, a good heat transfer to the heat sink part is guaranteed.

In some embodiments, the first main terminals of the switching elements are directly connected to the assigned heat sink part. In such embodiments, the current is conducted from the second submodule terminal of the first submodule to the first submodule terminal of the second submodule entirely via the heat sink part.

In some embodiments, the first main terminals of the switching elements can be connected to the heat sink part by an electrically-conductive layer attached to the assigned heat sink part. In such embodiments, the current is conducted from the second submodule terminal of the first submodule to the first submodule terminal of the second submodule partly via the heat sink part and partly via the conductive layer. The electrically-conductive layer can be provided for simpler manufacturing. The heat transfer to the heat sink part may be hardly influenced or is not influenced at all by the electrically-conductive layer.

In some embodiments, the conductive layer may include a metal rail, which is connected to a respective heat sink part. This means that each heat sink part is assigned such a metal rail.

In some embodiments, the number of heat sinks is greater by one ("1") than the number of half bridge submodules. This also enables the heat to be efficiently dissipated from the switching elements that are interconnected with the input terminals of the converter and are each arranged alone on a separate heat sink part in the way described above.

In some embodiments, the heat sink parts comprise cooling surfaces. The heat sink parts may comprise cooling ribs for example, around which air can flow. In some embodiments, the heat sink parts can have a coolant that is able to flow through them. Through this, heat dissipation from the switching elements is possible. To this end the heat sink parts can each have a fluid flowing through them. The heat sink parts can also be equipped with what are known as heat pipes, in which a gas is vaporized, so that heat is drawn out of the heat sink part by the evaporation chill that arises. The vaporized gas condenses on air-cooled cooling ribs for example and is guided again, by gravitational force for example, in the direction of the part of the heat sink part on which the switching element to be cooled is arranged.

In some embodiments, the parts of the heat sink can be arranged in one plane. This produces a flatter converter in terms of its construction. In some embodiments, the heat sink parts of the heat sink can be arranged above one another, wherein the switching elements assigned to one heat sink part are arranged on opposing main surfaces of the assigned heat sink part. This makes it possible to manufacture the converter in a simple manner, since components arranged in such an assembly can be connected by pressing them together with one another.

In some embodiments, the electrical connection, e.g. the node point, may be between the second main terminal of the first switching element and the first main terminal of the second switching element of a respective submodule via one or more conductor tracks of the circuit carrier of the submodule. To this end the circuit carrier can have so-called thick conductor tracks (e.g. conductor track thicknesses of greater than 400 μm).

In some embodiments, two inverter arms are interconnected in series between the two input terminals per phase, wherein a node point between the two inverter arms is coupled to an output terminal of an inverter phase. In some embodiments, the converter comprises at least two submodules per inverter arm and phase.

In some embodiments, a respective submodule comprises a half bridge with two switching elements that are controllable and interconnected in series. The first submodule terminal may be connected electrically to a first main terminal of a first of the at least two switching elements (high-side switching element). The second submodule terminal may be connected electrically to a node point of a second main terminal of the first switching element and a first main terminal of a second of the at least two switching elements (low-side switching element).

In some embodiments, the submodule comprises a full bridge with two half bridges interconnected in parallel, wherein, in a first of the half bridges, a first and a second switching element are interconnected in series and in a second of the half bridges a third and a fourth switching element are interconnected in series. The first submodule terminal may be connected electrically to a node point of a second main terminal of the first switching element and a first main terminal of the second switching element. The second submodule terminal may be connected electrically to a node point of a second main terminal of the third switching element and a first main terminal of the fourth switching element. The first main terminals of the first and third switching element may be connected electrically to one another via a further part of the heat sink.

Figure 1:
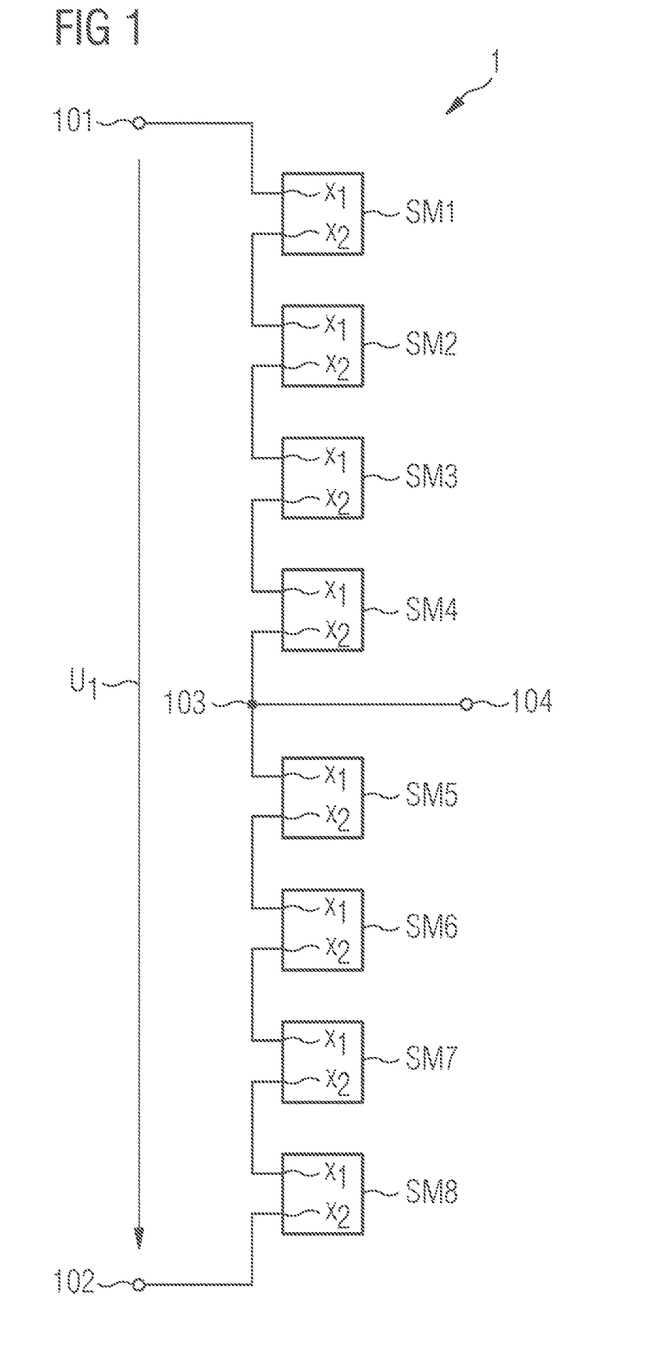
FIG. 1 shows the serial interconnection of a number of submodules for providing an inverter phase between an input terminal and an output terminal, according to teachings of the present disclosure.

FIG. 1 shows an inverter phase of a converter in so-called multilevel topology. In this figure, eight identically constructed submodules SM1, . . . , SM8 are interconnected with one another between an input terminal 101 and an input terminal 102. A node point 103 between the half bridge submodules SM4 and SM5 is interconnected with an output terminal 104 of the inverter phase. The submodules SM1, . . . , SM4 interconnected between the input terminal 101 and the node point 103 are assigned to an upper inverter arm in this case. The submodules SM1, . . . , SM8 interconnected in series between the node point 103 and the input terminal 102 are assigned to a lower inverter arm. A dc voltage $U_1$ is present between the input terminals 101 and 102. The input terminals 101, 102 may be terminals of a dc link circuit. Through a control circuit, which activates the switching elements contained in the respective submodules SM1, . . . , SM8 and switches them in a suitable manner to conduct or to block, an alternating voltage can be tapped off at the output terminal 104.

Figure 2:
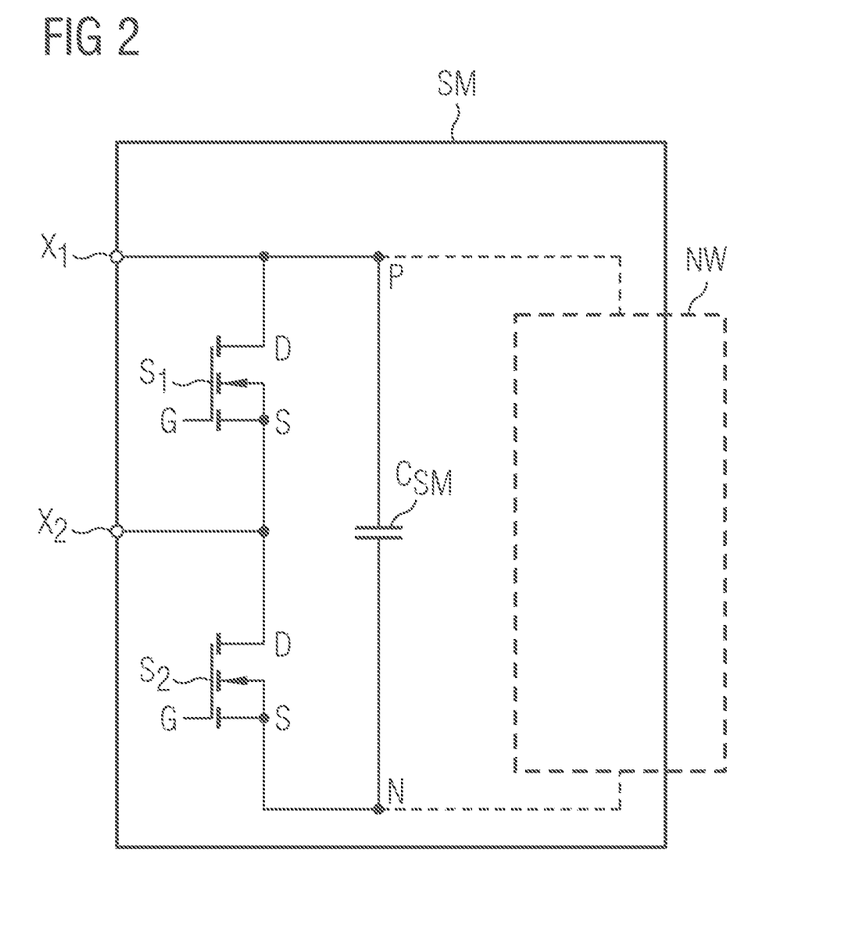
FIG. 2 shows an electrical equivalent circuit diagram of a half bridge submodule, according to teachings of the present disclosure.

FIG. 2 shows an electrical equivalent circuit diagram of submodules SM1, . . . , SM8 in the shape of a half bridge submodule. Thus each of the half bridge submodules SM comprises two switching elements $S_1$, $S_2$ interconnected in series. The switching elements $S_1$, $S_2$ involve MOSFETs or other controllable semiconductor switching elements for example. The first main terminal of the switching element $S_1$ referred to as the drain D, is connected to a first submodule terminal $X_1$. The second main terminal of the switching element $S_1$ referred to as the source S is connected to the drain terminal D of the second switching element $S_2$. The node point between the source terminal S of the switching element $S_1$ and the drain terminal of the switching element $S_2$ forms a second submodule terminal $X_2$. The source terminal of the second switching element $S_2$ is connected via a capacitor $C_{SM}$ to the drain terminal of the first switching element $S_1$. An optional output network NW can be connected in parallel to the capacitor $C_{SM}$, at the node points labeled with the reference characters P and N.

To provide an inverter phase with multilevel characteristic, as is shown in FIG. 1, the submodule terminals $X_1$, $X_2$ of the respective half bridge submodules may be interconnected with one another in series. Thus, as can readily be seen from FIG. 1, the first submodule terminal $X_1$ of the submodule SM1 is connected to the input terminal 101. The second submodule terminal $X_2$ of the submodule SM1 is connected to the first submodule terminal $X_1$ of the submodule SM2. The second submodule terminal $X_2$ of the submodule SM2 is connected in its turn to the first submodule terminal of the submodule SM3, etc. The second submodule terminal $X_2$ of the submodule SM8 is finally connected to the input terminal 102. As can be seen from FIG. 1, the output terminal 104 of the inverter phase of the converter 1 is connected via the node point 103 both to the second submodule terminal $X_2$ of the submodule SM4 and to the first submodule terminal $X_1$ of the submodule SM5.

Figure 3:
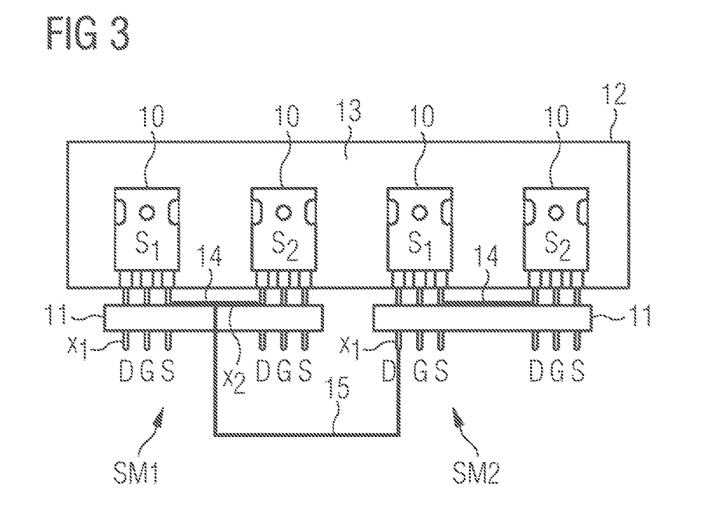
FIG. 3 shows a schematic diagram of two half bridge submodules arranged on a heat sink, according to teachings of the present disclosure.

In such an arrangement, this circuitry takes up a lot of space in the converter 1. FIG. 3 shows a possible construction variant for two circuit board-based submodules SM1, SM2 arranged as neighboring modules on a heat sink 12. In this construction variant each of the submodules SM1, SM2 is constructed using discrete power semiconductor switching elements and a circuit carrier. This produces better electrical characteristics when compared to the Direct Copper Bonding (DCB).

The submodules SM1, SM2 (naturally this also applies in a corresponding manner to the further submodules SM3, . . . , SM8, not shown in FIG. 3) each comprise a circuit carrier 11. Two power semiconductor switching elements 10 are attached to the circuit carrier 11 in each case. Each of the power semiconductor switching elements 10 comprises three contact pins, which are pushed through corresponding openings or holes drilled in the circuit carrier 11 not shown in any greater detail in FIG. 3 and soldered.

The three contact pins represent the drain terminal D (first main terminal), the source terminal S (second main terminal) and the gate terminal G (control terminal). An electrical connection between the source terminal of the power semiconductor switching element 10 labeled $S_1$ and the drain terminal of the power semiconductor switching element 10 labeled $S_2$ is made via a conductor track 14. Because of the high current flowing, the conductor track 14 can be embodied here as a thick copper conductor track. The electrical connection between the source terminal S of $S_1$ and the drain terminal D of $S_2$ forms the second submodule terminal $X_2$ explained in connection with FIG. 2. The first submodule terminal $X_1$ is the drain terminal D of the power semiconductor switching element 10 labeled $S_1$.

The removal of heat from the power semiconductor switching elements 10 is done directly at its drain terminals D by directly pressing the drain terminals D embodied on the rear side of the discrete power semiconductor switching elements 10 onto the heat sink 12 already mentioned. To avoid a short circuit of the drain terminals D via the heat sink 12, a layer of insulation 13 with good thermal transfer properties may be attached to the side of the heat sink 12 on the side facing towards the observer. To insure an internal contact between the rear-side contacts (drain terminals) of the power semiconductor switching elements 10 and the heat sink 12, the power semiconductor switching elements can be screwed onto the heat sink 12.

To establish the electrical connection between the second submodule terminal $X_2$ of the submodule SM1 and the first submodule terminal $X_1$ of the submodule SM2, in the arrangement in accordance with FIG. 3, a cable 15 is used. This may be fixed by screws electrically between corresponding contact surfaces of the circuit carrier 11 in the manner shown in FIG. 3. Because of the heat losses due to current occurring at the contact points between the cable 15 and the circuit carriers 11 concerned of the half bridge submodules SM1, SM2, large cable cross sections and large contacts may be used. This leads however to the mounting and connection technology ending up being very large and heavy.

Figure 4:
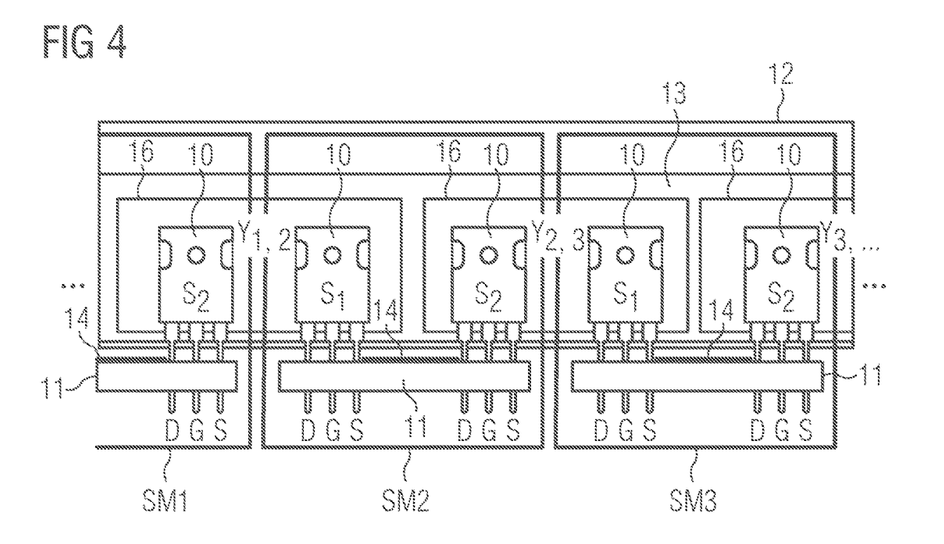
FIG. 4 shows a schematic diagram of a number of half bridge submodules on a heat sink, according to teachings of the present disclosure.

FIG. 4 shows a variant embodiment. In the diagram depicted in FIG. 4 the switching module SM1 is shown in part, as are the switching modules SM2 and SM3 interconnected in series with this module. The electrical connection labeled with the reference character 15 in FIG. 3 is replaced in the construction variant shown in FIG. 4 by a conductive layer 16, arranged between the discrete power semiconductor switching elements 10 and the insulation layer 13 on the heat sink 12. In this case the drain terminal of the second switching element $S_2$ of one half bridge submodule (e.g. SM1) and the drain terminal of the first switching element $S_1$ of the neighboring half bridge submodule (SM2) may be attached to the conductive layer 16 and connected electrically conductively to said layer. The drain terminal of the second switching element $S_2$ of the half bridge submodule SM2 and the drain terminal D of the first switching element $S_1$ of the neighboring half bridge submodule (here: SM3) may be attached to another conductive layer. Thus, the drain terminals of the switching elements of neighboring half bridge submodules may be each attached in pairs to a respective conductive layer 16.

The exclusive contact of the drain terminals D of the discrete power semiconductor switching elements of the half bridge submodules SM enables the series circuit of the half bridge submodules to be constructed in a very compact manner. In some embodiments, a compact series circuit with minimal mounting effort is produced. A direct cooling of the electrical contacts and of the electrical layers is possible. The electrical layers may be realized in the shape of metal rails.

The node point or output terminal can be realized with the aid of the conductive layer. In such embodiments, the conductive layer can have a lug pointing away from the circuit carriers, so that a screw connection or a plug-in connection can be made to the output terminal in the flat area of the lug. A reduced current flow via the respective circuit carrier of the half bridge submodules is produced, since a large part of the current is tapped off directly at the drain terminals of the power semiconductor switching elements. Through this a lower thermal stress on the respective circuit carrier is produced.

In some embodiments, all contacting points (e.g. the drain terminals of the power semiconductor switching elements) are also those points at which the heat of the power semiconductor switching elements is removed. This means that there is an elimination of the separation between electrical and thermal paths. The dissipation of heat from the semiconductor switching elements to the heat sink 12 is only minimally influenced by the electrically conductive layer 16, since this can be provided with a very high thermal coupling coefficient. In some embodiments, the conductive layers 16 consist of copper or aluminum or alloys thereof.

Figure 5:
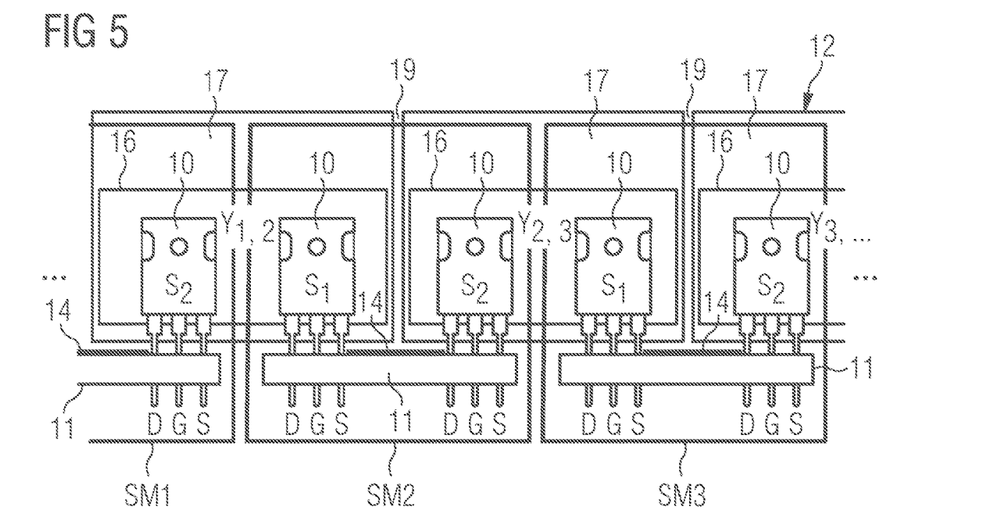
FIG. 5 shows a schematic diagram of a number of half bridge submodules on a heat sink comprising a number of heat sink, according to teachings of the present disclosure, wherein the heat sink parts are arranged in one plane.

FIG. 5 shows an alternative construction variant. This construction variant is based on the exemplary embodiment shown in FIG. 4. To avoid repetitions, only differences from the construction variant shown in FIG. 4 are described. In this variant, the heat sink 12 comprises a number of heat sink parts 17. The number of heat sink parts 17 is greater by one than the number of submodules, if these comprise a half bridge with two switching elements that are controllable and are interconnected in series, as is shown. The heat sink parts 17 may be separated from one another by an air gap 19. The size of the air gap 19 may be dimensioned so that a difference in potential occurring between the heat sink parts does not lead to an electrical flashover.

While the heat sink may be separated from a potential of the working voltage in the construction variant in accordance with FIG. 4 because of the use of the insulation layer 13, in the embodiment shown in FIG. 5 the heat sink parts 17 provide current conduction. The respective power semiconductor switching elements may be connected by their first main terminal, not only thermally but also electrically, to an assigned heat sink part 17. The conductive layer 16 shown in FIG. 5 may be between the first main terminals of the controllable power semiconductor switching elements 10 and the assigned heat sink parts 17. By dispensing with the insulation layer, a better removal of heat from the power semiconductor switching elements 10 may result, since there can be a direct cooling of the electrical contacts (drain terminals).

The heat sink parts 17 may include a bus bar configuration with good conductivity and may be formed from copper or aluminum. The heat sink parts 17 being electrically insulated from one another make it possible to dispense with the insulation layer between the heat sink parts and the first main terminals D of the power semiconductor switching elements. The reduction of the heat transfer resistance enables the power/weight ratio of the converter to be increased overall.

Since the individual heat sink parts 17 have a working potential, the electrical insulation of the heat sink parts 17 is of significance. The functional insulation between the heat sink parts 17 occurs, as described, via a respective air gap 19 between neighboring heat sink parts. The air gap can be filled with a solid insulator. If the heat sink parts are to be cooled with a fluid of a common fluid circuit, then an electrically non-conductive fluid is used, so that a short circuit via the cooling medium is not caused.

In the embodiment shown in FIG. 5, the heat sink parts 17 are arranged next to one another in one plane, so that, depending on the number of submodules SM1, SM2, SM3, . . . , a flat converter embodied longitudinally is produced. In some embodiments, the heat sink parts 17 can be arranged above one another. This is shown for example in the embodiment depicted in FIG. 6.

Figure 6:
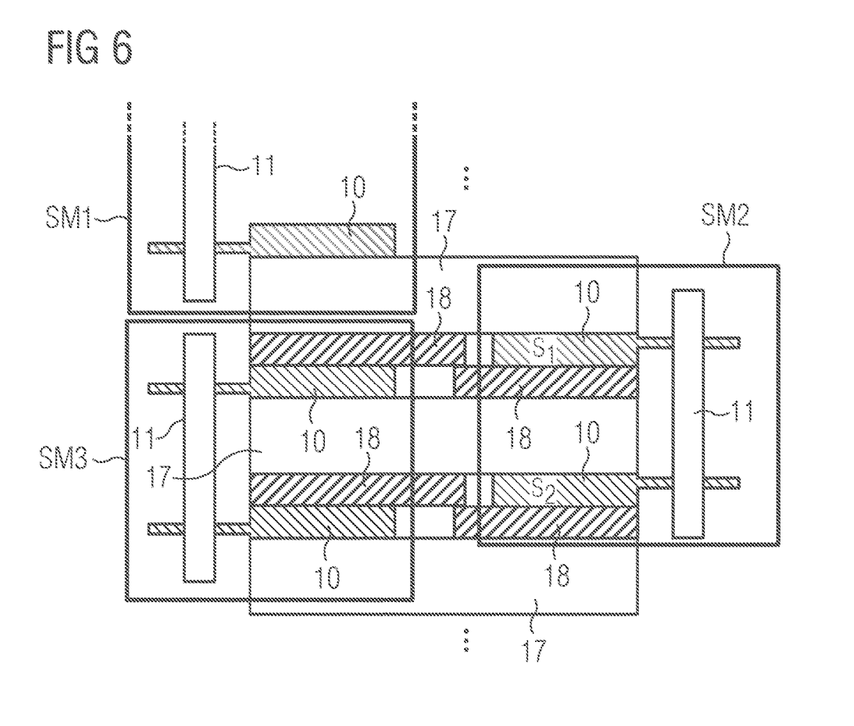
FIG. 6 shows a schematic diagram of a number of half bridge submodules on a heat sink comprising a number of heat sink parts, according to teachings of the present disclosure, wherein the heat sink parts are stacked above one another.

In such embodiments, the power semiconductor switching elements 10 fastened to a respective heat sink part 17 are not only arranged on opposing main sides of the heat sink part 17, but may be arranged at opposite ends, so that the submodules SM1, SM2, SM3 are arranged alternately on opposing end face sides of the heat sink parts 17. In addition, a springy insulation layer 18 (e.g. an electrically insulating layer) may be arranged between a power semiconductor switching element 10 and the neighboring heat sink part 17, so that the construction of the converter can be realized in an interference fit. In this the heat sink parts 17 are used as a single bus bar configuration for series connection of the power semiconductor switching elements. In such a construction, it is sufficient to press together the whole assembly consisting of power semiconductor switching elements, heat sink parts, and springy layers of insulation at the outer ends. This not only makes manufacturing easier but also makes possible a converter constructed in a very compact manner.

In the event of such an interference fit heat pipes can be used to dissipate heat from the flat-design heat sink parts 17. To avoid short circuits between the heat sink parts, an electrically non-conductive cooling medium may be used. The exclusive contacting of the drain terminals D of the semiconductor switching elements of the half bridge submodules SM may enable the series circuit of the submodules to be constructed as a very compact circuit. Through the omission of the insulation between the drain terminals D and the heat sink parts 17 the heat dissipation may be improved.

The construction outlined by way of example in FIGS. 5 and 6 may have the following advantages:

A compact interconnection with minimal mounting effort—the series circuit of the submodules, when said circuit is present in a stack as in FIG. 6, does not need any screw or clamp contacts on the switching elements. In the realization shown in FIG. 5 screw and clamp contacts can be used. Such contacting is only required or possible for the submodules that are connected to the input terminals 101, 102 of the converter.

The direct cooling of the electrical contacts and the bus bar configurations may produce an optimized heat dissipation from the power semiconductor switching elements. The heat sink parts are used themselves as an electrical bus bar configuration, whereby the actual bus bars can be kept to a minimum or can even be dispensed with. This allows small and compact converters to be realized. A design as a compact interference fit assembly is possible.

A reduced current flow may be produced via the respective circuit carrier of the half bridge submodules, since a large part of the current is tapped off directly at the drain terminals of the power semiconductor switching elements. This produces a lower thermal stress on the respective circuit carriers.

The proposed type of contacting in FIGS. 5 and 6 is also able to be realized in SMD (Surface Mounted Device) technology.

The description in FIGS. 2 to 6 makes reference to half bridge submodules of an inverter phase. The teachings herein can readily be transferred to full bridge submodules. A full bridge submodule comprises four switching elements in two parallel paths, wherein in each path two of the switching elements are interconnected in series with one another. In such a full bridge submodule, the drain terminals of the two high-side switching elements are connected on a common, electrically-conductive heat sink part. The low-side switching elements are connected to switching elements of two neighboring full bridge submodules in each case via a further heat sink part.

The invention claimed is:

1. A converter for converting an input voltage between two input terminals into an alternating voltage with a prespecified amplitude and frequency for the activation of a single or multiphase load, the converter comprising:
   at least two submodules of an inverter arm connected in series with one another; and
   a heat sink;
   wherein each of the submodules comprises:
      a circuit carrier;
      at least two controllable switching elements electrically connected to one another on the circuit carrier;
      a first submodule terminal; and
      a second submodule terminal;
   a set of first main terminals of the controllable switching elements of the at least two submodules connected thermally over their surface to a cooling surface of the heat sink;
   wherein the heat sink comprises a number of heat sink parts electrically insulated from one another; and
   an electrical connection of the second submodule terminal of the first submodule to the first submodule terminal of the second submodule includes a respective assigned heat sink part of the heat sink.

2. The converter as claimed in claim 1, wherein the first main terminals of the switching elements comprise flat contacts attached by their full surface to the respective assigned heat sink part.

3. The converter as claimed in claim 1, wherein the first main terminals of the switching elements are connected by a force fit or a material-to-material fit to the respective assigned heat sink part.

4. The converter as claimed in claim 1, wherein the first main terminals of the switching elements are connected directly to the assigned heat sink part.

5. The converter as claimed in claim 1, wherein the first main terminals of the switching elements are connected via a conductive layer attached to the respective assigned heat sink part to said part.

6. The converter as claimed in claim 5, wherein the conductive layer comprises a metal rail.

7. The converter as claimed in claim 1, comprising exactly one more heat sink than a number of half bridge submodules present in the converter.

8. The converter as claimed in claim 1, wherein the heat sink parts comprise cooling surfaces.

9. The converter as claimed in claim 1, wherein the heat sink parts are arranged in one plane.

10. The converter as claimed in claim 1, wherein the heat sink parts of the heat sink are arranged above one another; and
the switching elements assigned to a heat sink part are arranged on main surfaces of the assigned heat sink part lying opposite one another.

11. The converter as claimed in claim 1, wherein an electrical connection between a second main terminal of the first switching element and a first main terminal of the second switching element of a half bridge submodule includes one or more conductor tracks of the circuit carrier of the half bridge submodule.

12. The converter as claimed in claim 1, wherein two inverter arms are connected in series between the two input terminals per phase; and
a node point is coupled between the two inverter arms to an output terminal of an inverter phase.

13. The converter as claimed in claim 12, further comprising at least two submodules per inverter arm and phase.

14. The converter as claimed in claim 1, wherein:
a respective submodule comprises a half bridge with two controllable and series-interconnected switching elements;
each of the at least two switching elements comprises a respective first main terminal and a respective second main terminal;
the first submodule terminal is connected electrically to the first main terminal of one of the first of the at least two switching elements;
the second submodule terminal is connected electrically to a node point of the second main terminal of the first switching element and the first main terminal of a second of the at least two switching elements.

15. The converter as claimed in claim 1, wherein:
the submodule comprises a full bridge with two half bridges interconnected in parallel;
in a first of the half bridges a first and a second switching element are interconnected in series and in a second of the half bridges a third and a fourth switching element are interconnected in series;
the first switching element comprises a first main terminal and a second main terminal having a node point;
the first submodule terminal is connected electrically to the node point of the second main terminal of the first switching element and the first main terminal of the second switching element;
the second submodule terminal is connected electrically to a node point of a second main terminal of the third switching element and a first main terminal of the fourth switching element;
the first main terminals of the first and third switching element are electrically connected to one another via a further heat sink part of the heat sink.

* * * * *